(12) United States Patent
Lima

(10) Patent No.: US 7,684,179 B1
(45) Date of Patent: Mar. 23, 2010

(54) ACTUATION MECHANISM FOR VERTICAL INSERTION, RETENTION AND EXTRACTION OF AN ELECTRONIC COMPONENT

(75) Inventor: David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 373 days.

(21) Appl. No.: 11/297,258

(22) Filed: Dec. 8, 2005

(51) Int. Cl.
 G06F 1/16 (2006.01)
 H05K 5/00 (2006.01)
 H05K 7/00 (2006.01)

(52) U.S. Cl. ............................ 361/679.33; 361/679.37; 361/732

(58) Field of Classification Search ................. 361/679, 361/685, 726, 728, 729, 730, 731, 732, 679.33, 361/679.37, 679.39
See application file for complete search history.

(56) References Cited

U.S. PATENT DOCUMENTS

| | | | | | |
|---|---|---|---|---|---|
| 4,875,873 | A | * | 10/1989 | Ishizuka et al. | 439/157 |
| 4,931,907 | A | * | 6/1990 | Robinson et al. | 361/727 |
| 5,115,376 | A | * | 5/1992 | Nakajima | 361/798 |
| 5,171,156 | A | * | 12/1992 | Nagasaka et al. | 439/157 |
| 5,205,752 | A | * | 4/1993 | Taguchi et al. | 439/157 |
| 5,244,400 | A | * | 9/1993 | Hatagishi | 439/157 |
| 5,454,080 | A | * | 9/1995 | Fasig et al. | 361/683 |
| 5,721,669 | A | * | 2/1998 | Becker et al. | 361/727 |
| 6,052,278 | A | * | 4/2000 | Tanzer et al. | 361/725 |
| 6,195,259 | B1 | * | 2/2001 | Whitman et al. | 361/725 |
| 6,616,106 | B1 | * | 9/2003 | Dean et al. | 361/685 |
| 2002/0008964 | A1 | * | 1/2002 | Hutchison et al. | 361/727 |
| 2003/0117779 | A1 | * | 6/2003 | Gough et al. | 361/728 |
| 2006/0171110 | A1 | * | 8/2006 | Li | 361/685 |
| 2007/0091559 | A1 | * | 4/2007 | Malone | 361/685 |

* cited by examiner

*Primary Examiner*—Jayprakash N Gandhi
*Assistant Examiner*—Adrian S Wilson
(74) *Attorney, Agent, or Firm*—Shumaker & Sieffert, P.A.

(57) ABSTRACT

An electronic device includes a bay for a removable component with a vertical axis of insertion and removal. The component is inserted upwardly in the electronic device with aid of an actuation mechanism. For example, the actuation mechanism may include a lever and a horizontal support member sized to hold the bottom side of the component. Rotation of the lever translates the support member in the vertical direction to smoothly lift the component into a seated position in which connectors in the component and the electronic device are coupled. The actuation mechanism may include a latch to hold the component securely in the seated position. Rotation of the lever in the opposite direction lowers the support member. The actuation mechanism may include one or more tabs on the horizontal support member or elsewhere that pull the component during removal to overcome the unmating force of the connectors.

26 Claims, 4 Drawing Sheets

ACTUATION MECHANISM FOR VERTICAL INSERTION, RETENTION AND EXTRACTION OF AN ELECTRONIC COMPONENT

TECHNICAL FIELD

The invention relates to electronic devices and, more specifically, actuation mechanisms for insertion and removal of electronic components.

BACKGROUND

Removable components in an electronic device, such as power supplies, printed circuit boards or other electrical components, require a dependable and secure electrical connection to the electronic device. The electrical connection typically must withstand temperature variation, humidity, shock and vibration during the operation of the electronic device. Electronic devices are often designed such that removable components have a horizontal axis of insertion. In other words, creating an electrical connection between the removable component and the electronic device requires moving the component horizontally relative to the electronic device. In this horizontal configuration, an electronic device may include bays sized to hold a removable component such that gravity helps stabilize and guide the removable component in place. With little interference from gravity, the insertion and extraction forces are dependent on the actual force required to join (mate) and separate (unmate) connectors of the removable component and the electronic device.

An electronic device may also receive some or all removable components vertically depending on the design and configuration of the electronic device. As compared to horizontal insertion and extraction, vertical insertion and extraction can be more difficult. Vertical insertion of components may be in either the downwards direction or in the upwards direction. With either arrangement, insertion and extraction forces include gravity. If a component is installed in the downwards direction, gravity is helping to mate the connectors. If the component is heavy, the force of gravity may be greater than the mating force and actually damage the connector if the connectors do not line up properly during insertion. Removal of the component can also be difficult because an operator has to overcome not only the unmating force but also gravity. If the component is installed in an upwards direction, gravity is resisting the mating force of the connector. If the component is heavy, the force on the component due to gravity may exceed the unmating force of the connector and cause the component to fall out of the connector.

SUMMARY

Embodiments of an electronic device include a bay for a removable component with a vertical axis of insertion and removal. The component is inserted upwardly in the electronic device with aid of an actuation mechanism. For example, the actuation mechanism may include a lever and a horizontal support member sized to hold the bottom side of the component. By moving the lever, an operation can smoothly raise the support member to lift the component into a seated position in which connectors in the component and the electronic device are coupled. The lever may include a handle to allow the operator to more easily grip the level. Some designs include a latch to hold the component securely in the seated position. For removal, an operator moves the lever in the opposite direction. The actuation mechanism may include one or more tabs on the horizontal support member or elsewhere that pull the component during removal to overcome the unmating force of the connectors. The actuation mechanism may be particularly useful for heavy components.

In one embodiment, an electronic device comprises a housing forming a bay sized to hold a removable component of the electronic device and an actuation mechanism. The actuation mechanism includes a lever and a support member coupled to the lever and sized to support the removable component. An operator may seat the removable component within the electronic device by placing the removable component within the bay on the support member and rotating the lever about a fixed point to lift the support member.

In another embodiment, an actuation electronic device comprises a lever and a support member coupled to the lever and sized to support the removable component. An operator may seat the removable component within an electronic device by placing the removable component on the support member and rotating the lever about a fixed point to lift the support member.

In another embodiment, a method comprises placing a removable component of an electronic device on a support member within a bay sized to hold the removable component, and rotating a lever coupled to the support member about a fixed point to lift the support member and seat the removable component within the electronic device.

Embodiments may provide one or more of the following advantages. A removable component may be easily and securely mounted within a vertical bay of an electronic device. Furthermore, because embodiments provide for controlled lifting of a removable component to seat it within the bay rather than downward motion, connectors are not likely to be damaged in the event the component is misaligned with the electronic device. Embodiments also secure a removable component using an upward insertion, even if the component's weight is great enough to overcome the unmating force of connectors on the component. In addition, embodiments allow for easy and controlled removal of the removable component.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
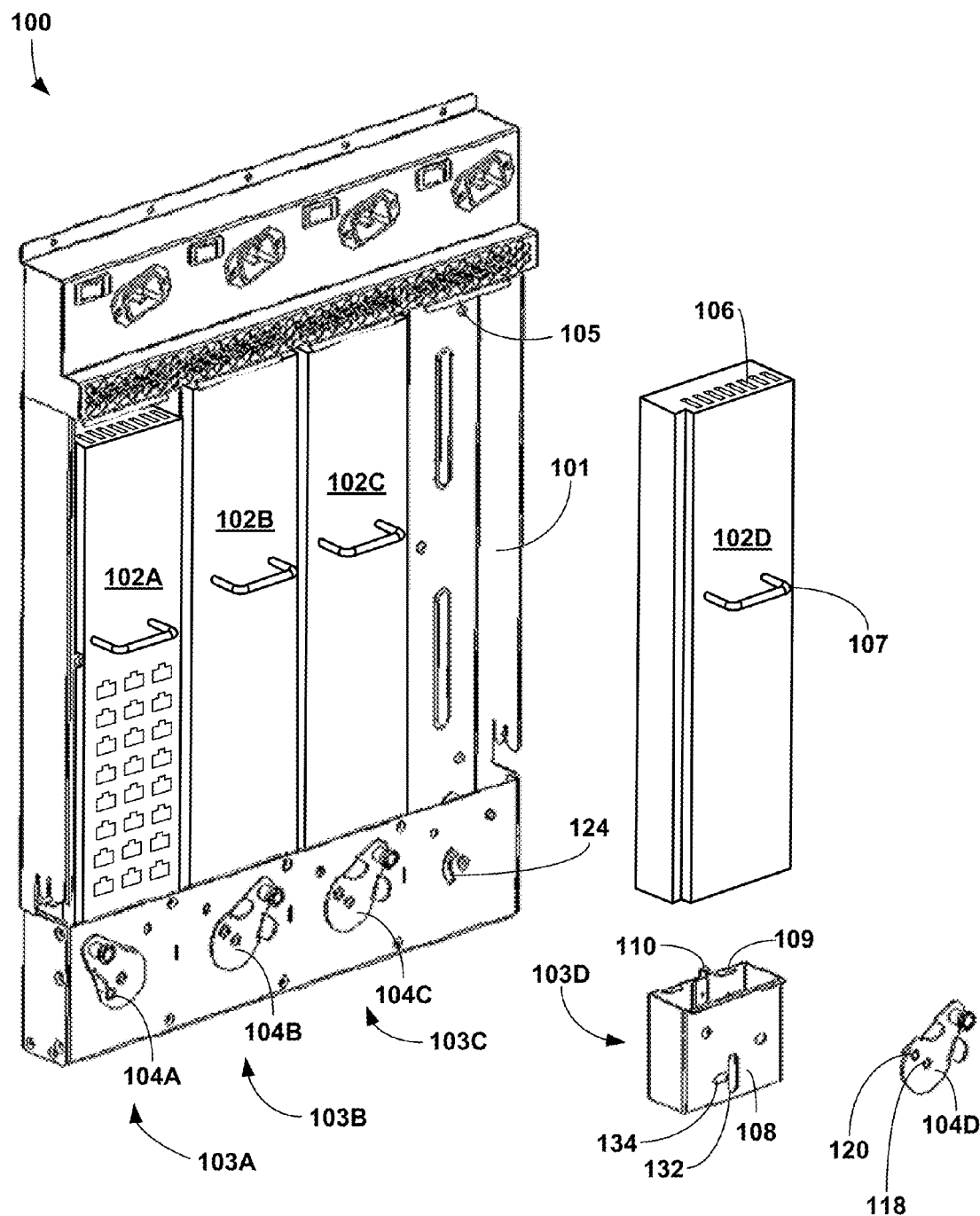
FIG. 1 is an illustration of a portion of an electronic device including actuation mechanisms to seat removable components within bays of the electronic device.

FIG. 1 is an illustration of a portion of an electronic device 100 including actuation mechanisms 103A-D ("actuation mechanisms 103") that seat removable components 102A-D ("components 102") within bays formed by housing 101. Components 102 have a vertical axis of insertion within electronic device 100. In the exemplary embodiment of FIG. 1, components 102 are seated within electronic device 100 using levers 104A-D ("levers 104") to lift the component 102. Connectors 105 are adjacent to an upper portion of the bay formed by housing 101. By moving a lever 104, an operator can smoothly lift a component 102 in a vertical direction into a seated position in which connectors in the component, e.g., connectors 106, and the electronic device, e.g., connectors 105 are joined. For removal, an operator moves a lever 104 in the opposite direction to unseat and lower the corresponding component 102.

Removable component 102D is shown removed from electronic device 100, exposing an empty bay within housing 100. Actuation mechanism 103D is shown in an exploded view with more detail than actuation mechanisms 103A-C. For exemplary purposes, actuation mechanisms 103 will be described in reference to actuation mechanism 103D, even though each of actuation mechanisms 103 may be substantially similar. In this example, actuation mechanism 103D includes support member 108 having top surface 109, which is sized to support removable component 102D. Actuation mechanism 103D can also support removable components of different sizes.

Actuation mechanism 103D also includes lever 104D. Lever 104D rotates about bolt 118 fixed to housing 101 of electronic device 100. Lever 104D includes pin 120 that fits through slot 124 in housing 101. Pin 120 fits within hole 134 on support member 108 and rotatably couples lever 104D to support member 108. Pin 120 interacts with hole 134 such that vertical motion of pin 120 is transferred to support member 108 as lever 104D rotates about bolt 118. As support member 108 moves, slot 132 in support member 108 slides over bolt 118, which is fixed to housing 101.

Actuation mechanism 103D functions to seat and unseat removable component 102D. To seat removable component 102D an operator places removable component 102D with a bay formed by housing 101 and on top surface 109 of support member 108. The operator may grasp handle 107 to control removable component 102D. The operator then horizontally slides removable component 102D back within the bay to engage removable component 102D with tab 110. Other mechanisms may be used to engage the removable component, such as a screw, bolt, latch or other means for engaging the component.

After placing removable component 102D within the bay, it will be inserted within housing 100 and resting in a low, unseated position, similar to removable component 102A. The operator then turns lever 104D clockwise to seat removable component 102D. The amount of rotation depends upon the vertical distance component 102D must travel prior to engaging connector 105. In one embodiment, operator turns lever 104D about a quarter turn. Seating removable component 102D joins connectors 106 on removable component 102D with connectors 105 of electronic device 100. This allows removable component 102D to function as part of electronic device 100. In the example of FIG. 1, removable components 102B and 102C are illustrated in raised, seated positions.

To remove removable component 102D, an operator turns lever 104D counter clockwise (e.g., about a quarter turn) to its previous position, thereby unseating and lowering support member 108. Tab 110 engages removable component 102D and exerts a downward force on the removable component due to rotation of lever 104, thereby causing connectors 106 to release from connectors 105. Once removable component 102D is unseated and lowered to the lowest position, the operator can lift the component out of the bay formed by housing 101.

In this manner, actuation mechanisms 103 provide for controlled and easy vertical installation and removal of removable components 102 while substantially limiting any horizontal movement. This may reduce the chance for damage to removable components 102 or electronic device 100 during installation and removal. Furthermore, actuation mechanisms 103 lock to securely hold removable components 102 in a seated position (i.e., engaged position) to ensure a secure electrical connection during operation of electronic device 100, even in the event of vibration, humidity, physical shock, temperature variations or other conditions.

Electronic device 100 may be any electronic device using removable components. For example, electronic device 100 may be a network router, switch, hub, firewall, virtual private network (VPN) appliance, network security electronic device or other electronic device. Removable components 102 may also be any removable component for an electronic device. For example, removable components 102 may be power supplies, data storage components, network interface cards, service cards or other component of the electronic device. For example, removable component 102A may comprise a network interface card, removable component 102B may comprise a power supply, and removable component 102C comprise a data storage component.

Figure 2A:
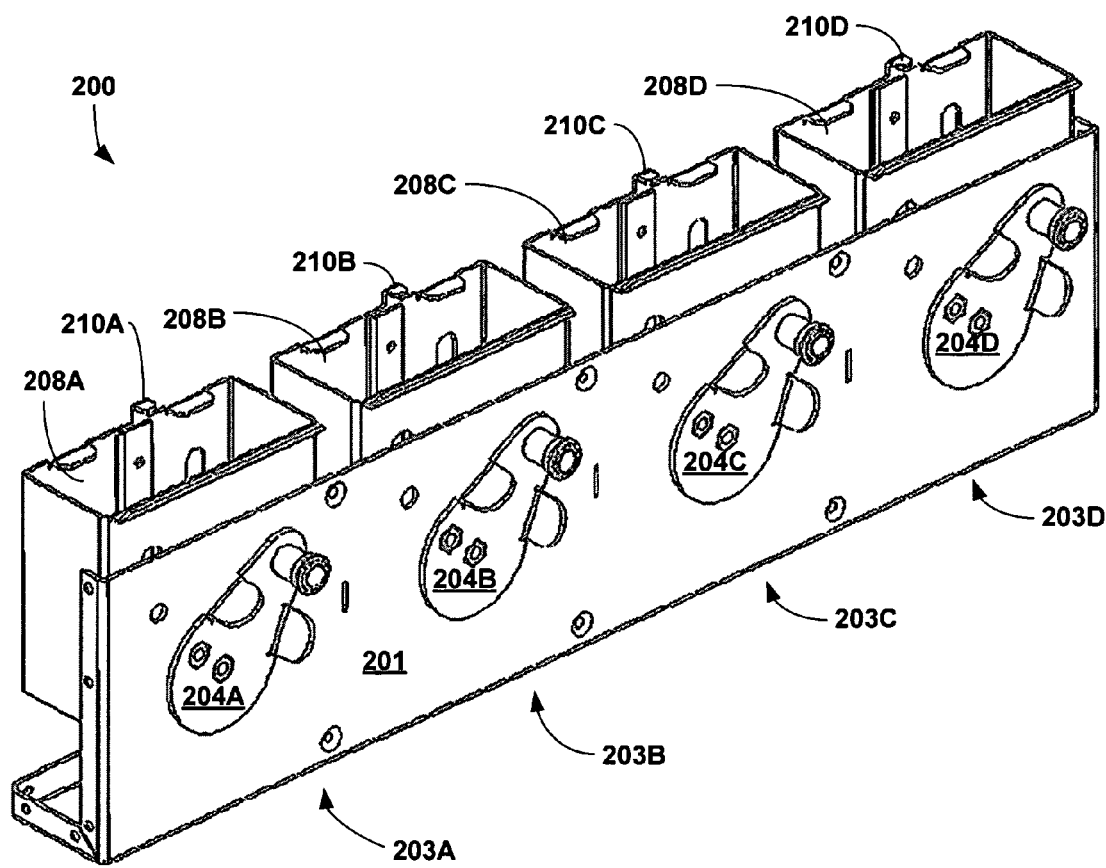
FIGS. 2A-B are illustrations of a set of actuation mechanisms.
Figure 2B:
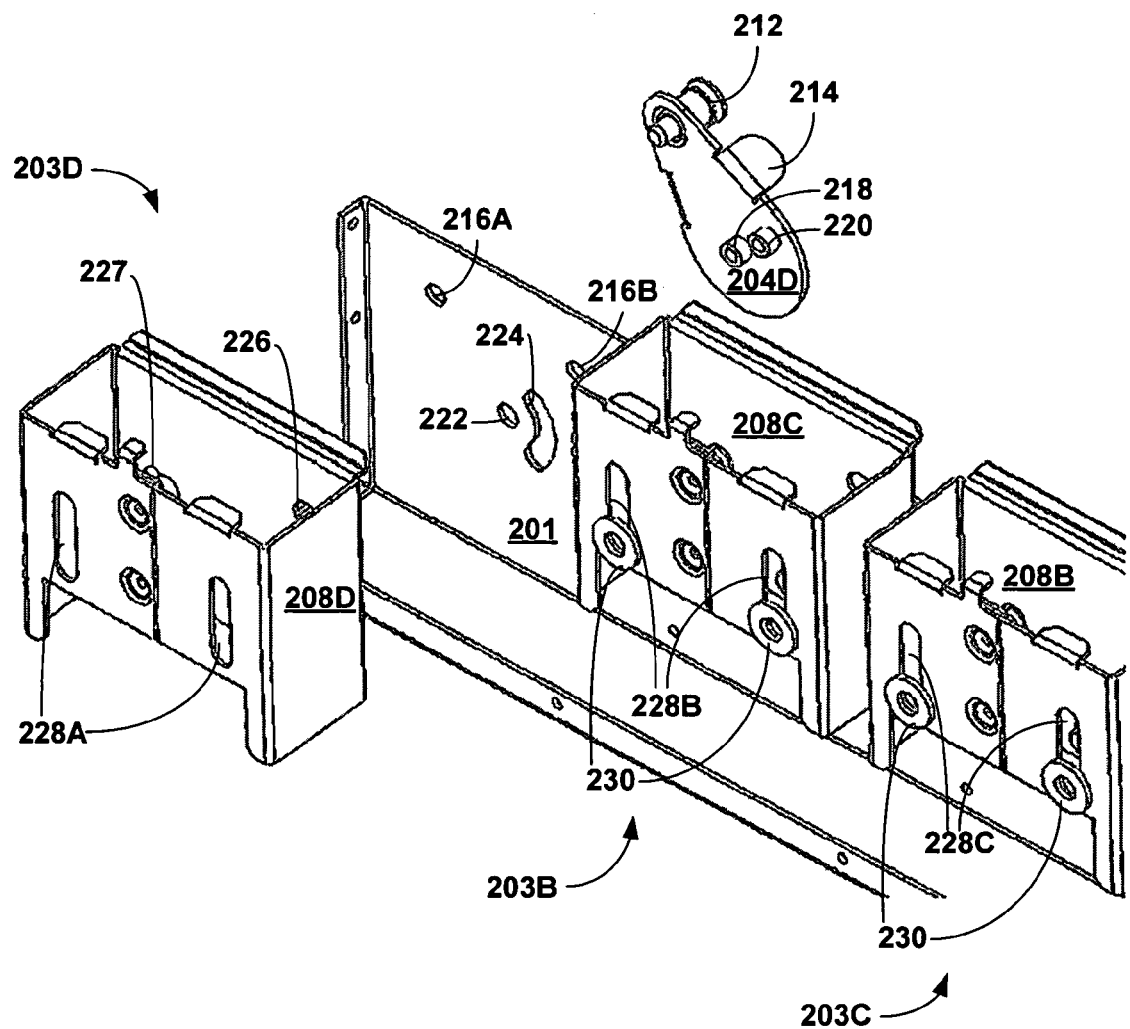

FIGS. 2A-B are illustrations of assembly 200 including actuation mechanisms 203A-D ("actuation mechanisms 203"). FIG. 2A shows a front-side view of assembly 200, and FIG. 2B shows a close-up rear-view of assembly 200. Assembly 200 is part of an electronic device, such as electronic device 100 of FIG. 1, and provides actuation to seat and unseat removable components of the electronic device along a vertical axis of insertion relative to the electronic device.

Actuation mechanisms 203 include levers 204A-D ("levers 204") and support members 208A-D ("support members 208"). Support members 208 are sized to support the removable components. Tabs 210A-D ("tabs 210") are also part of support members 208. Tabs 210 serve to engage removable components placed on support members 208. With tabs 210, actuation mechanisms 203 not only capable of exerting an upward force, but also a downward force on the removable components while substantially limiting any horizontal movement.

The operation of actuation mechanisms 203 will be described in reference to actuation mechanism 203D, as shown in FIG. 2B. An operator can hold on to handle 212 and tab 214 to grip lever 204D. To raise and lower action mechanism 203D, the operator rotates lever 204D. Lever 204D rotates about bolt 218, which is fixed to housing 201 of the electronic device. Lever 204D includes pin 220 that fits through slot 224 in housing 201. Pin 220 fits within a hole (not shown) on support member 208D. As lever 204D rotates the vertical movement of pin 220 is translated to support member 208 to lift and lower support member 208. As support member 208D moves, slot 232 in support member 208 slides over bolt 218, which is fixed to housing 201. While not shown for support member 208D, but shown for support members 208B and 208C, support members 208 are stabilized by pins 230, which are fixed to the housing of the electronic device. Because each support member 208 includes two slots 228A-C, support members 208 cannot rotate during actuation, and movement of support members 208 is limited to vertical translation.

Housing 201 forms holes 216A-B ("holes 216"). Handle 212 extends beyond the inner surface of lever 204 and may be inserted within either of holes 216 to secure (i.e., lock) actuation mechanism 203D in place. For example, handle 212 may include a spring to bias the handle toward housing 201 and, upon release by the administrator, into one of holes 216A or 216B. Hole 216A may be used to lock actuation mechanism 203D in a raised position, while hole 216B may be used to lock the actuation mechanism in a lowered position. For increased stability, support member 208D includes holes 227 and 226. When in the lowered position, handle 212 not only locks into hole 216B within housing 201, but also hole 226 within support member 208D, which lines up with hole 216B in the lowered position. In the same manner, hole 227 lines up with hole 216A in the raised position. In this manner, the support member 208D may be locked to hold a removable component in either a seated or an unseated position.

Figure 3A:
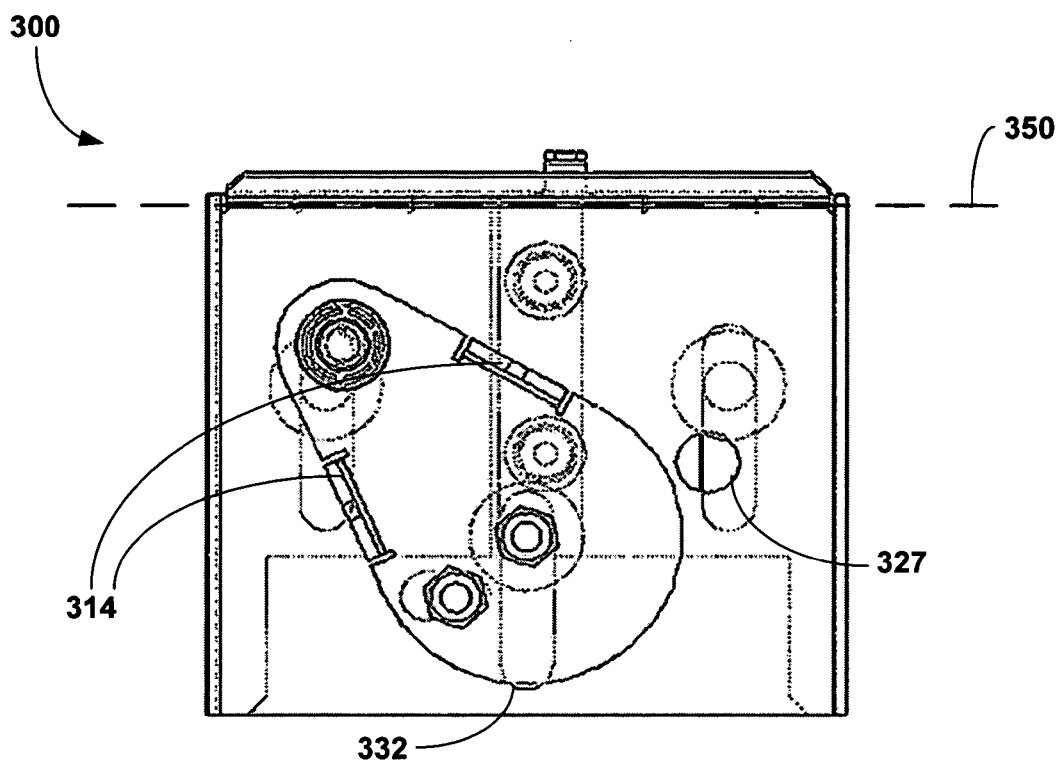
FIGS. 3A-B are side-view illustrations of an actuation mechanism.
Figure 3B:
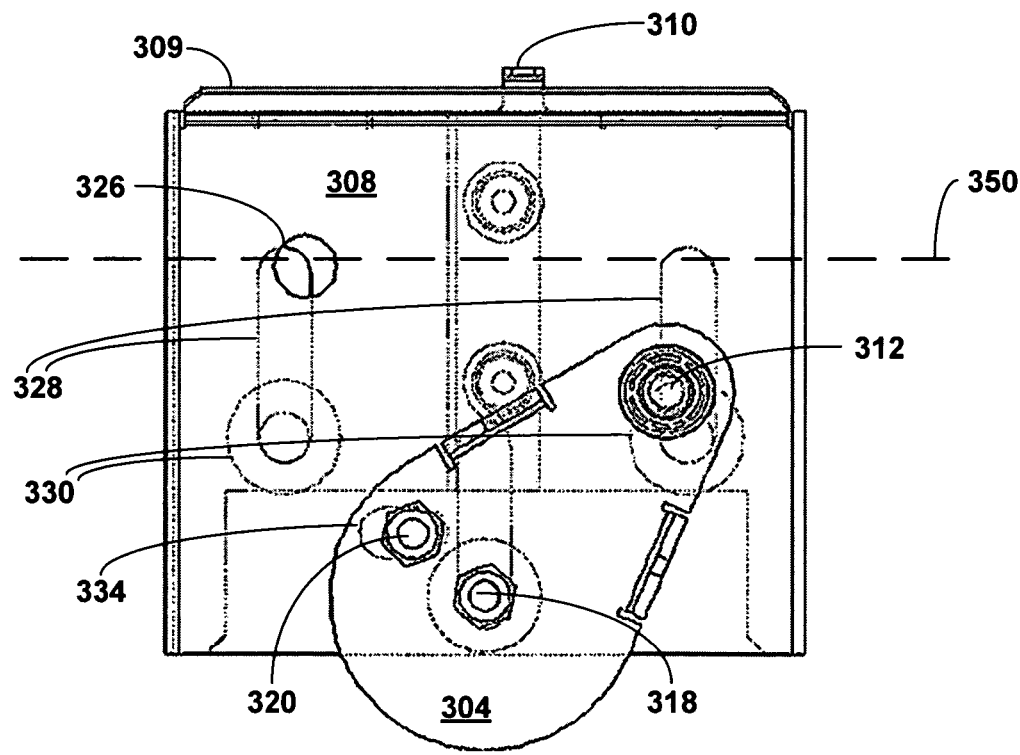

FIGS. 3A-B are side-view illustrations of actuation mechanism 300. FIG. 3A shows actuation mechanism 300 in a lowered position, and FIG. 3B shows actuation mechanism 300 in a raised position. Line 350 indicates a top edge of support member 300 in the lowered position, and is shown in FIG. 3B to illustrate the relative displacement of support member 308 when placed in the raised position along the vertical axis of insertion.

Actuation mechanism 300 includes lever 304 and support member 308. Support member 308 is sized to support the removable components. Tabs 310 are part of support member 308 and function to engage a removable component placed on support member 308. Tabs 310 allow actuation mechanism 300 to push up and pull down a removable component.

The operation of actuation mechanism 300 is as follows. An operator places a removable component on top surface 309 of support member 308 and within a bay of the electronic device. The operator slides the removable component into this position to engage tab 310. To raise and lower action mechanism 300, the operator rotates lever 304D. The operator can hold on to handle 312 and tabs 314 to grip lever 304. Lever 304 rotates about bolt 318, which is fixed relative to line 350, e.g., fixed to a housing of the electronic device (not shown). Lever 304 includes pin 320 to engage hole 334 of support member 308. Vertical motion of pin 320 is translated to support member 308 via hole 334 as lever 304D rotates about bolt 318. As support member 308D moves, slot 332 in support member 308 slides over bolt 318. Support member 308 is stabilized by pins 330, which are fixed relative to line 350, e.g., fixed to the housing of the electronic device. Because support member 308 includes two slots 328, support member 308 only moves up and down without rotating during actuation.

Handle 312 extends beyond the inner surface of lever 304 and fits within either of holes 326 and 327 to secure actuation mechanism 300D in place. Hole 327 locks actuation mechanism in a raised position. In this manner, the extended portion of handle 312 acts as latch coupled to lever 304 to secure a removable component in a seated position within the electronic device. In the same way, hole 326 locks actuation mechanism in a lowered position. For stability, handle 312 may also fit through holes in the housing of the electronic device in both the lower and raised positions.

Various embodiments of the invention have been described. Variations to the described embodiments may be made within the spirit of the claimed invention. For example, the described embodiments generally refer to an electronic device including a housing forming more than one bay, each with a corresponding actuation mechanism. Other embodiments may include as few as one bay and/or as few as one actuation mechanism. Furthermore, support members of actuation mechanisms are shown to be approximately the same size as the bottom surface of a removable component, but other embodiments may have support members larger or smaller than a bottom surface of the removable component. For example, a single support member may be used for removable components of multiple sizes.

These and other embodiments are within the scope of the following claims.

The invention claimed is:
1. An electronic device comprising:
a housing forming a bay sized to hold a removable component of the electronic device, wherein the housing includes an opening to the bay configured to receive the removable component in a non-vertical direction relative to the bay;
a set of electrical connectors adjacent to an upper portion of the bay; and
an actuation mechanism adjacent to a lower portion of the bay, the actuation mechanism having a lever and a support member coupled to the lever and sized to support the removable component,
wherein rotation of the lever about a fixed point translates the removable component in a vertical direction relative to the bay and away from the fixed point to electronically couple the removable component to the set of electrical connectors of the electronic device,
wherein the housing includes a base configured to support the housing in an upright position, including during insertion and removal of the removable component.

2. The electronic device of claim 1, wherein rotation of the lever translates the support member in a vertical direction between an unseated position in which the removable component is disengaged from the electronic device and a seated position in which the removable component is electronically coupled to the electronic device.

3. The electronic device of claim 1, wherein the support member is rotatably coupled to the lever and the support member maintains a horizontal position relative to the housing during rotation of the lever.

4. The electronic device of claim 1, wherein the support member is rotatably coupled to the lever with a pin that interacts with a hole of the support member to translate the support member vertically in response to rotation of the lever.

5. The electronic device of claim 4, wherein the lever is positioned outside the housing, the support member is positioned within the housing and the pin fits within a slot formed by the housing.

6. The electronic device of claim 1, wherein the actuation mechanism further includes a latch coupled to the lever to secure the removable component in a seated position within the electronic device.

7. The electronic device of claim 1, further comprising electrical connectors within an upper portion of the bay, wherein the removable component is electronically coupled to the electronic device via the electrical connectors when the support member is vertically translated to a raised position that seats the removable component within the electronic device.

8. The electronic device of claim 1, further comprising one or more tabs on the support member to engage the removable component.

9. The electronic device of claim 8, further comprising electrical connectors within an upper portion of the bay, wherein rotation of the lever in the opposite direction lowers the support member and the one or more tabs function to exert a downward force on the removable component and disengage the removable component from the electrical connectors.

10. The electronic device of claim 1, wherein the lever rotates about a bolt fixed to the housing.

11. The electronic device of claim 1, wherein the electronic device comprises one of a router, a switch, a hub, a firewall, a virtual private network (VPN) appliance or a network security electronic device.

12. The electronic device of claim 1, wherein the electronic device comprises a router and the removable component comprises a network interface card.

13. An actuation electronic device comprising:
- a housing forming a bay sized to hold a removable electronic component, wherein the housing includes an opening to the bay configured to receive the removable component in a non-vertical direction relative to the bay;
- a support member sized to support the removable component; and
- a rotatable lever coupled to the support member,
- wherein rotation of the lever about a fixed point translates the removable component away from the fixed point in a vertical direction between an unseated position in which the removable component is disengaged from an electronic device and a seated position in which the removable component is electronically coupled to the electronic device,
- wherein the housing includes a base configured to support the housing in an upright position, including during insertion and removal of the removable component.

14. The actuation electronic device of claim 13, wherein the support member maintains a horizontal position during rotation of the lever.

15. The actuation electronic device of claim 14, wherein the support member is rotatably coupled to the lever with a pin that interacts with a hole of the support member to translate the support member vertically in response to rotation of the lever.

16. The actuation electronic device of claim 13, wherein the actuation mechanism further includes a latch coupled to the lever to secure the removable component in a seated position within the electronic device.

17. The actuation electronic device of claim 13, further comprising one or more tabs on the support member to engage the removable component.

18. The actuation electronic device of claim 17, wherein the one or more tabs function to pull the removable component from connectors of the electronic device as the operator lowers the support member.

19. The actuation electronic device of claim 13, wherein the lever rotates about a bolt fixed to a housing of the electronic device.

20. A method comprising:
- placing a removable component of an electronic device on a support member within a bay of the removable component, wherein the bay is sized to hold the removable component, and wherein an opening to the bay is configured to receive the removable component in a non-vertical direction relative to the bay; and
- rotating a lever coupled to the support member about a fixed point to translate the removable component away from the fixed point in a vertical direction relative to the electronic device and seat the removable component within the electronic device,
- wherein the electronic device includes a base configured to support the electronic device in an upright position, including during insertion and removal of the removable component.

21. The method of claim 20, further comprising securing the removable component in a seated position within the electronic device using a latch coupled to the lever.

22. The method of claim 21, wherein securing the removable component in a seated position within the electronic device includes inserting a handle of the lever within a hole formed by a housing of the electronic device to hold the support member in a fixed position.

23. The method of claim 20, further comprising rotating the lever in an opposite direction to lower the support member and unseat the removable component.

24. The electronic device of claim 1, wherein the opening to the bay is configured to receive the removable component in a substantially horizontal direction.

25. The actuation electronic device of claim 13, wherein the removable component comprises a power supply.

26. The actuation electronic device of claim 13, wherein the removable component device comprises a data storage component.

* * * * *